(12) United States Patent
Egbe

(10) Patent No.: US 8,110,535 B2
(45) Date of Patent: Feb. 7, 2012

(54) SEMI-AQUEOUS STRIPPING AND CLEANING FORMULATION FOR METAL SUBSTRATE AND METHODS FOR USING SAME

(75) Inventor: Matthew I. Egbe, West Norriton, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 12/841,540

(22) Filed: Jul. 22, 2010

(65) Prior Publication Data
US 2011/0034362 A1 Feb. 10, 2011

Related U.S. Application Data

(60) Provisional application No. 61/231,393, filed on Aug. 5, 2009.

(51) Int. Cl.
*C11D 7/26* (2006.01)
*C11D 7/32* (2006.01)
*C11D 7/50* (2006.01)

(52) U.S. Cl. ........ 510/176; 510/175; 510/245; 510/255; 510/258; 510/499; 510/504; 510/505; 510/506

(58) Field of Classification Search .................. 510/175, 510/176, 245, 255, 258, 49, 504, 505, 506
See application file for complete search history.

(56) References Cited

U.S. PATENT DOCUMENTS

| 5,597,420 | A | 1/1997 | Ward | |
|---|---|---|---|---|
| 6,475,966 | B1 | 11/2002 | Sahbari | |
| 6,627,587 | B2 | 9/2003 | Naghshineh et al. | |
| 6,723,691 | B2 | 4/2004 | Naghshineh et al. | |
| 6,851,432 | B2 | 2/2005 | Naghshineh et al. | |
| 7,700,533 | B2 * | 4/2010 | Egbe et al. | 510/175 |
| 2004/0048761 | A1 * | 3/2004 | Ikemoto | 510/175 |
| 2004/0067860 | A1 | 4/2004 | Lee | |
| 2006/0014656 | A1 * | 1/2006 | Egbe et al. | 510/175 |
| 2006/0016785 | A1 | 1/2006 | Egbe et al. | |
| 2006/0094612 | A1 | 5/2006 | Kimura | |
| 2006/0293208 | A1 * | 12/2006 | Egbe et al. | 510/407 |
| 2007/0099805 | A1 * | 5/2007 | Phenis et al. | 510/175 |
| 2009/0227483 | A1 * | 9/2009 | Liu et al. | 510/176 |

FOREIGN PATENT DOCUMENTS

| EP | 1612858 A2 | 1/2006 |
|---|---|---|
| EP | 1023129 B1 | 1/2007 |
| WO | 0114510 A1 | 3/2001 |
| WO | 0227409 A1 | 4/2002 |
| WO | 03006598 A1 | 1/2003 |
| WO | 03006599 A1 | 1/2003 |
| WO | 03060045 A1 | 7/2003 |

* cited by examiner

*Primary Examiner* — Gregory Delcotto
(74) *Attorney, Agent, or Firm* — Joseph D. Rossi; Geoffrey L. Chase

(57) ABSTRACT

The present invention relates to semi-aqueous formulations and the method using same, to remove bulk photoresists, post-etched and post-ashed residues, as well as contaminations. The formulation comprises: an alkanolamine, a water miscible organic co-solvent, a quarternary ammonium compound, a non-free acid functionality corrosion inhibitor, and remainder water. The pH is greater than 9.

1 Claim, No Drawings

SEMI-AQUEOUS STRIPPING AND CLEANING FORMULATION FOR METAL SUBSTRATE AND METHODS FOR USING SAME

CROSS REFERENCE TO RELATED APPLICATION

The present patent application claims the benefit of U.S. Provisional Patent Application Ser. No. 61/231,393 filed Aug. 5, 2009.

BACKGROUND OF THE INVENTION

In the manufacture of semiconductors and semiconductor microcircuits, it is frequently necessary to coat substrate materials with a polymeric organic substance. Examples of some substrate materials includes, aluminum, titanium, copper, silicon dioxide coated silicon wafer, optionally having metallic elements of aluminum, titanium, or copper, and the like. Typically, the polymeric organic substance is a photoresist material. This is a material which will form an etch mask upon development after exposure to light for photolithography. In some cases, the photoresist layer needs be reworked. In subsequent processing steps, at least a portion of the photoresist is removed from the surface of the substrate. One common method of removing photoresist from a substrate is by wet chemical means. The wet chemical compositions formulated to remove the photoresist from the substrate should do so without corroding, dissolving, and/or dulling the surface of any metallic circuitry; chemically altering the inorganic substrate; and/or attacking the substrate itself. Another method of removing photoresist is by a dry ash method where the photoresist is removed by plasma ashing using either oxygen or forming gas, such as hydrogen. The residues or by-products may be the photoresist itself or a combination of the photoresist, underlying substrate and/or etch gases. These residues or by-products are often referred to as sidewall polymers, veils or fences.

Increasingly, reactive ion etching (RIE), is the process of choice for pattern transfer during via, metal line and trench formation. For instance, complex semi-conductor devices, such as advanced DRAMS and microprocessors, which require multiple layers of back end of line interconnect wiring, utilize RIE to produce vias, metal lines and trench structures. Vias are used, through the interlayer dielectric, to provide contact between one level of silicon, silicide or metal wiring and the next level of wiring.

Metal lines are conductive structures used as device interconnects. Trench structures are used in the formation of metal line structures. Vias, metal lines and trench structures typically expose metals and alloys, such as Al, Al and Cu alloys, Cu, Ti, TiN, Ta, TaN, W, TiW, silicon or a silicide such as a silicide of tungsten, titanium or cobalt. The RIE process typically leaves a residue or a complex mixture that may include re-sputtered oxide material, organic materials from photoresist, and/or antireflective coating materials used to lithographically define the vias, metal lines and or trench structures.

It is desirable to provide a cleaning formulation and process capable of removing those unwanted materials without corroding, dissolving or dulling the exposed surface of the substrate. In some instances the unwanted materials are polymeric compositions referred to as photoresists. In other instances the unwanted materials to be removed are residues of etching or ashing processes or simply contaminants.

Patents in this technological field include U.S. Pat. Nos. 6,627,587, 6,723,691, 6,851,432 to Naghshineh et al., and published patent application US2006/0016785.

BRIEF SUMMARY OF THE INVENTION

A general goal of this project is to develop a non-hydroxylamine, stripping and cleaning formulation for metal substrate, such as aluminum and copper substrate. Such a stripper will have a lower cost of ownership (COO) than hydroxylamine strippers.

Accordingly, one aspect of the present invention is a formulation for removing bulk photoresists, as well as post-etched and post-ashed residues. The formulation comprises: an alkanolamine, a water miscible organic co-solvent, a quarternary ammonium compound, a non-free acid functionality corrosion inhibitor, and remainder water. The pH is greater than 9. For this invention, "miscible" includes soluble.

According to another aspect of the present invention, a method of removing bulk photoresists as well as post-etched and post-ashed residues from a substrate comprises: applying a formulation as recited above to a substrate to remove the photoresist, post-etched and post-ashed residues, as well as contaminants from the substrate.

DETAILED DESCRIPTION OF THE INVENTION

This invention describes formulations designed primarily for the removal of photoresist, post-etched and post-ashed residues, as well as contaminants from metal substrates. The formulation comprises an alkanolamine, a water miscible organic co-solvent, a quarternary ammonium compound, a corrosion inhibitor, and remainder water. The pH is greater than 9. For this invention, "miscible" includes soluble.

In certain embodiments, alkanolamine includes but is not limited to: monoethanolamine, N-methylethanolamine, triethanolamine, isopropanolamine, diethylhydroxylamine and mixtures thereof.

In certain embodiments, the water miscible organic co-solvent may be glycol ether or a furfuryl alcohol. The glycol ethers may include glycol mono($C_1$-$C_6$)alkyl ethers and glycol di($C_1$-$C_6$)alkyl ethers, such as but not limited to, ($C_1$-$C_{20}$) alkane diols, ($C_1$-$C_6$)alkyl ethers, and ($C_1$-$C_{20}$)alkane diol di($C_1$-$C_6$)alkyl ethers. Examples of glycol ethers are to dipropylene glycol methyl ether, tripropylene glycol methyl ether, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylene glycol monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy)ethanol, and mixtures thereof. More typical examples of glycol ethers are propylene glycol monomethyl ether, propylene glycol monopropyl ether, tri(propylene glycol) monomethyl ether and 2-(2-butoxyethoxy) ethanol. An example of a furfuryl alcohol is Tetrahydrofurfuryl alcohol (THFA).

The total organic solvents (alkanolamine and water miscible organic co-solvent) is in the range of 1 wt % to 50 wt %, while a preferred range is 5 wt % to 40 wt %. The deionized (DI) water is 40 wt % to 95 wt %, while the preferred range is 50 wt % to 80 wt %.

In certain embodiments, the quarternary ammonium compound includes but is not limited to: quarternary ammonium hydroxide, such as tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide,(1-hydroxypropyl)trimethylammonium hydroxide, ethyltrimethylammonium hydroxide, diethyldimethylammonium hydroxide and benzyltrimethylammonium hydroxide and mixtures thereof. The quaternary ammonium compounds are present in an amount ranging from 0.5% to 10% or from 5% to 10% by weight.

In certain embodiments, the composition may include 0.5% to 15% by weight of one or more corrosion inhibitors. Any corrosion inhibitor known in the art for similar applications may be used. Examples of corrosion inhibitors that may be used include: catechol, t-Butylcatechol, pyrogallol, benzotriazole (BZT), resorcinol, esters of gallic acid and mixtures thereof. These are non-free acid functionality corrosion inhibitors which avoid corrosion of metals.

Examples of particular corrosion inhibitors which have free acid functionality and have been shown in the examples below to not adequately protect metals from corrosion include: anthranilic acid, gallic acid, octanoic acid, stearic acid, benzoic acid, isophthalic acid, maleic acid, fumaric acid, D,L-malic acid, malonic acid, phthalic acid, maleic anhydride, phthalic anhydride, carboxybenzotriazole, lactic acid, citric acid, the like and mixtures thereof or with the preceding list of corrosion inhibitors.

Although the present invention has been principally described in connection with cleaning semiconductor substrates, the cleaning formulations of the invention can be employed to clean any substrate or semiconductor device that includes organic and inorganic residues.

EXAMPLES

The following examples are provided for the purpose of further illustrating the present invention, but are by no means intended to limit the same.

Examples of formulations in the invention are given below. The abbreviations used in the formulations are listed below.
THFA=Tetrahydrofurfural alcohol
TMAH=Tetramethylammonium hydroxide
DPM=Dipropylene glycol methyl ether
TBAH=Tetrabutylammonium hydroxide
MEA=Monoethanolamine
NMEA=N-methylethanolamine
p-TSA=p-Toluenesulfonic acid
t-PGME=tripropylene glycol methyl ether
PG=Propylene glycol
DEHA=Diethylhydroxyamine In the following examples, all amounts are given in weight percent and add up to 100 weight percent. The compositions disclosed herein were prepared by mixing the components together in a vessel at room temperature until all solids have dissolved. Examples of certain compositions disclosed herein are set forth in TABLE I.

TABLE I

| Example A | | Example B | | Example C | |
|---|---|---|---|---|---|
| t-PGME | 29.00 | THFA | 29.00 | MEA | 30.00 |
| p-TSA | 1.50 | p-TSA | 1.50 | p-TSA | 1.50 |
| TBAH (55%) | 6.00 | TBAH (55%) | 6.00 | TBAH (55%) | 5.00 |
| Gallic acid | 1.50 | Gallic acid | 1.50 | PG | 1.00 |
| DI Water | 62.00 | DI Water | 62.00 | Gallic acid | 1.50 |
| | | | | DI Water | 61.00 |

| Example D | | Example E | | Example F | |
|---|---|---|---|---|---|
| THFA | 10.00 | THFA | 10.00 | DPM | 10.00 |
| MEA | 10.00 | MEA | 10.00 | MEA | 12.00 |
| p-TSA | 1.50 | p-TSA | 1.50 | p-TSA | 1.50 |
| TBAH (55%) | 1.00 | TBAH (55%) | 1.50 | TBAH (55%) | 1.50 |
| Gallic acid | 1.50 | Gallic acid | 1.50 | Gallic acid | 2.00 |
| DI Water | 76.00 | DI Water | 75.50 | DI Water | 73.00 |

| Example G | | Example H | | Example I | |
|---|---|---|---|---|---|
| DPM | 10.00 | DPM | 10.00 | DPM | 10.00 |
| MEA | 7.00 | MEA | 7.00 | MEA | 12.00 |
| p-TSA | 1.50 | p-TSA | 1.50 | p-TSA | 1.50 |
| TBAH (55%) | 1.50 | TBAH (55%) | 2.50 | TBAH (55%) | 2.50 |
| Gallic acid | 1.50 | Gallic acid | 2.00 | Gallic acid | 1.50 |
| DI Water | 78.50 | DI Water | 77.00 | DI Water | 72.50 |

| Example J | | Example K | | Example L | |
|---|---|---|---|---|---|
| THFA | 10.00 | THFA | 10.00 | THFA | 10.00 |
| MEA | 7.00 | MEA | 7.00 | MEA | 12.00 |
| p-TSA | 1.50 | p-TSA | 1.50 | p-TSA | 1.50 |
| TBAH (55%) | 1.50 | TBAH (55%) | 2.50 | TBAH (55%) | 1.50 |
| Gallic acid | 2.00 | Gallic acid | 1.50 | Gallic acid | 1.50 |
| DI Water | 78.00 | DI Water | 77.50 | DI Water | 73.50 |

| Example M | | Example N | | Example O | |
|---|---|---|---|---|---|
| THFA | 10.00 | DPM | 10.00 | DPM | 10.00 |
| MEA | 12.00 | MEA | 7.00 | MEA | 7.00 |
| p-TSA | 1.50 | p-TSA | 1.50 | p-TSA | 1.50 |
| TBAH (55%) | 2.50 | TBAH (55%) | 1.50 | TBAH (55%) | 1.50 |
| Gallic acid | 2.00 | catechol | 5.00 | PG | 0.00 |
| DI Water | 72.00 | Gallic acid | 2.00 | catechol | 5.00 |
| | | DI Water | 73.00 | DI Water | 75.00 |

| Example P | | Example Q | | Example R | |
|---|---|---|---|---|---|
| DPM | 10.00 | DPM | 10.00 | DPM | 10.00 |
| MEA | 7.00 | MEA | 7.00 | MEA | 7.00 |
| p-TSA | 1.50 | p-TSA | 1.50 | p-TSA | 1.50 |
| TBAH (55%) | 1.50 | TBAH (55%) | 1.50 | TMAH (25%) | 2.00 |
| catechol | 0.50 | catechol | 0.50 | catechol | 5.00 |
| Gallic acid | 1.50 | DI Water | 79.50 | Gallic acid | 2.00 |
| DI Water | 78.00 | | | DI Water | 72.50 |

| Example S | | Example T | | Example U | |
|---|---|---|---|---|---|
| DPM | 10.00 | DPM | 10.00 | DPM | 10.00 |
| MEA | 10.00 | MEA | 10.00 | MEA | 10.00 |
| TBAH (55%) | 2.50 | TBAH (55%) | 2.50 | TBAH (55%) | 2.50 |
| Octanoic acid | 1.00 | Octanoic acid | 3.00 | Stearic acid | 1.00 |
| DI Water | 76.50 | DI Water | 74.50 | DI Water | 76.50 |

| Example V | | Example W | | Example X | |
|---|---|---|---|---|---|
| DPM | 10.00 | DPM | 9.40 | DPM | 10.00 |
| NMEA | 10.00 | MEA | 17.50 | MEA | 12.00 |
| TMAH (25%) | 2.50 | TMAH (25%) | 2.40 | TMAH (25%) | 5.00 |
| Pyrogallol | 10.00 | t-Butylcatechol | 2.40 | t-Butylcatechol | 2.50 |
| DI Water | 67.50 | DI Water | 68.30 | DI Water | 70.50 |

TABLE I-continued

| Example Y | | Example Z | | Example A1 | |
|---|---|---|---|---|---|
| DPM | 10.00 | DPM | 10.00 | DPM | 7.40 |
| MEA | 10.00 | NMEA | 19.00 | MEA | 19.00 |
| TMAH (25%) | 2.50 | TMAH (25%) | 5.00 | TMAH (25%) | 3.50 |
| t-butylbenzoic acid | 3.00 | t-Butylcatechol | 2.50 | t-Butylcatechol | 2.30 |
| DI Water | 74.50 | DI Water | 70.50 | DI Water | 67.80 |

| Example A2 | | Example A3 | | Example A4 | |
|---|---|---|---|---|---|
| DPM | 7.40 | DPM | 7.40 | DPM | 6.50 |
| MEA | 22.00 | MEA | 22.00 | MEA | 29.00 |
| TMAH (25%) | 2.30 | TMAH (25%) | 3.50 | TMAH (25%) | 2.00 |
| t-Butylcatechol | 2.30 | t-Butylcatechol | 3.00 | t-Butylcatechol | 2.60 |
| DI Water | 66.00 | DI Water | 64.10 | DI Water | 59.90 |

| Example A5 | | Example A6 | | Example A7 | |
|---|---|---|---|---|---|
| DPM | 12.00 | DPM | 12.00 | DPM | 12.00 |
| MEA | 22.00 | MEA | 22.00 | MEA | 19.00 |
| TMAH (25%) | 2.30 | TMAH (25%) | 3.50 | TMAH (25%) | 2.30 |
| t-Butylcatechol | 3.00 | t-Butylcatechol | 2.30 | t-Butylcatechol | 2.30 |
| DI Water | 60.70 | DI Water | 60.20 | DI Water | 64.40 |

| Example A8 | | Example A9 | |
|---|---|---|---|
| DPM | 12.00 | DPM | 17.00 |
| MEA | 19.00 | MEA | 14.00 |
| TMAH (25%) | 3.50 | TMAH (25%) | 2.50 |
| t-Butylcatechol | 3.00 | t-Butylcatechol | 2.00 |
| DI Water | 62.50 | DEHA | 3.00 |
| | | DI Water | 61.50 |

| Example A10 | | Example A11 | |
|---|---|---|---|
| DPM | 10.00 | TPM | 13.00 |
| MEA | 12.00 | MEA | 13.00 |
| TMAH (25%) | 5.00 | TMAH (25%) | 4.34 |
| t-Butylcatechol | 2.50 | t-Butylcatechol | 3.00 |
| DEHA | 2.00 | DEHA | 1.70 |
| DI Water | 68.50 | PG | 4.34 |
| | | DI Water | 60.62 |

Complex semiconductor devices, such as DRAMs and microprocessors, which require multiple layers of back-end-of-line (BEOL) interconnect wiring, utilize reactive ion etching (RIE) to produce vias, metal lines and Pads. The vias, used in the cleaning experiments, were through an interlayer dielectric to an etch stop, such as; TiN, SiN, etc., while the metal lines were conductive structures used as device interconnects.

Some of the substrates (Metal 1 to 3) were ashed, while others were not ashed. When the substrates were ashed, the main residues to be cleaned were etchant residues. If the substrates were not ashed, then the main residues to be cleaned or stripped were both etch residues and photoresists. Metals 1 to 3 are various circuit structures, each fabricated from aluminum metal.

Cleaning tests were run using 305 mL of the cleaning compositions in a 400 mL beaker with a ½" round Teflon stir bar set at 600 rpm. The cleaning compositions were heated to the desired temperature, indicated below, on a hot plate, if necessary. Wafer segments approximately 1"×1" in size were immersed in the compositions under the following set of conditions: process time ranging from 1 minute to 30 minutes, at a process temperature ranging from 25° C. to 75° C.

The cleaning results are summarized in TABLE II.

TABLE II

| Strippers | Via | | Pad | | Metal 1 | Metal 2 | Metal 3 |
| | Unashed | ashed | Unashed | ashed | | | |
|---|---|---|---|---|---|---|---|
| Example A | N/A | N/A | N/A | N/A | Cleaned | Cleaned | Partially cleaned |
| Example B | N/A | N/A | N/A | N/A | Cleaned | Cleaned | Partially cleaned |
| Example C | N/A | N/A | N/A | N/A | Cleaned | Cleaned | Not cleaned |
| Example D | N/A | N/A | N/A | N/A | Cleaned | Cleaned | Partially cleaned |
| Example E | N/A | N/A | N/A | N/A | Cleaned | Cleaned | Partially cleaned |
| Example F | N/A | N/A | N/A | N/A | Cleaned | Cleaned | Not cleaned |
| Example G | N/A | N/A | N/A | N/A | Cleaned | Cleaned | Not cleaned |
| Example H | N/A | N/A | N/A | N/A | Cleaned | Cleaned | Partially cleaned |
| Example I | Partially cleaned | cleaned | Partially cleaned | cleaned | Etched (corroded) | Etched (corroded) | Etched (corroded) |
| Example J | Partially cleaned | cleaned | Partially cleaned | Partially cleaned | Etched (corroded) | Etched (corroded) | Etched (corroded) |
| Example L | Partially cleaned | Partially cleaned | Partially cleaned | Partially cleaned | Etched (corroded) | Etched (corroded) | Etched (corroded) |
| Example M | Partially cleaned | Partially cleaned | Partially cleaned | Partially cleaned | Etched (corroded) | Etched (corroded) | Etched (corroded) |
| Example N | Partially cleaned | Partially cleaned | Partially cleaned | Partially cleaned | Etched (corroded) | Etched (corroded) | Etched (corroded) |
| Example O | Partially cleaned | Partially cleaned | Partially cleaned | Partially cleaned | Etched (corroded) | Etched (corroded) | Etched (corroded) |
| Example P | Partially cleaned | Partially cleaned | Partially cleaned | Partially cleaned | Etched (corroded) | Etched (corroded) | Etched (corroded) |
| Example Q | Partially cleaned | Cleaned | Partially cleaned | cleaned | Etched (corroded) | Etched (corroded) | Etched (corroded) |

TABLE II-continued

| Strippers | Via Unashed | Via ashed | Pad Unashed | Pad ashed | Metal 1 | Metal 2 | Metal 3 |
|---|---|---|---|---|---|---|---|
| Example R | Partially cleaned | Cleaned | Partially cleaned | Cleaned | Etched (corroded) | Etched (corroded) | Etched (corroded) |
| Example S | Partially cleaned | Partially cleaned | Partially cleaned | cleaned | Etched (corroded) | Etched (corroded) | Etched (corroded) |
| Example T | Cleaned | Cleaned | Cleaned | Cleaned | Etched (corroded) | Etched (corroded) | Etched (corroded) |
| Example U | Cleaned | Cleaned | Cleaned | cleaned | Partially corroded | Partially corroded | Partially corroded |
| Example V | Cleaned | Cleaned | Cleaned | Cleaned | Cleaned | Cleaned | Cleaned |
| Example W | Cleaned | Cleaned | Cleaned | Partially cleaned | Cleaned | Cleaned | Cleaned |
| Example X | Partially cleaned | Cleaned | Cleaned | Partially cleaned | Cleaned | Cleaned | Partially cleaned |
| Example Y | Cleaned | Cleaned | Cleaned | Cleaned | Partially corroded | Partially corroded | Partially corroded |
| Example Z | Cleaned | Cleaned | Cleaned | Cleaned | Partially corroded | Cleaned | Cleaned |
| Example A1 | Cleaned | Cleaned | Cleaned | Cleaned | Partially corroded | Cleaned | Cleaned |
| Example A2 | Cleaned | Cleaned | Cleaned | Cleaned | Cleaned | Cleaned | Partially corroded |
| Example A3 | Cleaned | Cleaned | Cleaned | Cleaned | Partially corroded | Partially corroded | Partially corroded |
| Example A4 | Cleaned | Cleaned | Cleaned | Cleaned | Partially corroded | Partially corroded | Cleaned |
| Example A5 | Cleaned | Cleaned | Cleaned | Cleaned | Partially corroded | Partially corroded | Cleaned |
| Example A6 | Cleaned | Cleaned | Cleaned | Cleaned | Cleaned | Cleaned | Cleaned |
| Example A7 | Cleaned | Cleaned | Cleaned | Cleaned | Cleaned | Cleaned | Cleaned |
| Example A8 | Cleaned | cleaned | cleaned | Partially cleaned | Cleaned | Cleaned | Cleaned |
| Example 9 | Cleaned | Cleaned | Cleaned | Cleaned | Cleaned | Cleaned | cleaned |
| Example 10 | Cleaned | Cleaned | Cleaned | Cleaned | Sl. Corr. (cleaned) | Sl. Corr. (cleaned) | Cleaned |
| Example 11 | Cleaned | Cleaned | Cleaned | Cleaned | Cleaned | Sl. Corr. (cleaned) | Cleaned |

Sl. Corr. = slightly corroded

Among the different corrosion inhibitors used, formulations having pyrogallol and t-butylcatechol performed much better (Examples V, W-X, Z, A1-A8) in comparison with the commonly used corrosion inhibitors: gallic acid (Examples A-N), octanoic acid (Examples S-T), stearic acid (Example U), t-butylbenzoic acid (Example Y), catechol (Examples O, Q), or the combination of catechol and gallic acid (Examples N, P, R). The data in Table II indicates that the formulations using TMAH in 25% dilutions and corrosion inhibitors that did not have free acid functionality, either carboxylic acid or sulfonic acid ("non-free acid functionality") performed better in lifting photoresist and avoiding corrosion of metals.

The foregoing examples and description of the preferred embodiments should be taken as illustrating, rather than as limiting the present invention, as defined by the claims. As will be readily appreciated, numerous variations and combinations of the features set forth above can be utilized without departing from the present invention, as set forth in the claims. Such variations are not regarded as a departure from the spirit and scope of the invention, and all such variations are intended to be included within the scope of the following claims.

The invention claimed is:

1. A semi-aqueous stripping and cleaning composition comprising:
   a. 19-22% by weight monoethanolamine;
   b. dipropylene glycol methyl ether;
   c. 0.575-0.875% by weight tetramethylammonium hydroxide;
   d. t-Butylcatechol; and
   e. remainder water;
   wherein pH of the composition is greater than 9, and wherein the dipropylene glycol methyl ether and the tetramethylammonium hydroxide are present in the composition at a weight ratio of from 13.7:1 to 27.2:1 of dipropylene glycol methyl ether to tetramethylammonium hydroxide, the dipropylene glycol methyl ether and the monoethanolamine are present in the composition at a weight ratio of from 0.55:1 to 1.21:1 of dipropylene glycol methyl ether to monoethanolamine and the tetramethylammonium hydroxide and the tert-butylcatechol are present in the composition at a weight ratio of from 0.25:1 to 0.38:1 of tetramethylammonium hydroxide to tert-butylcatechol.

* * * * *